United States Patent [19]

Weldon

[11] 4,039,982
[45] Aug. 2, 1977

[54] COAXIAL CAVITY RADIO FREQUENCY TUNING CIRCUIT HAVING A TOROIDAL-SHAPED ELECTRODE TO EFFECT TUNING

[75] Inventor: James O. Weldon, Dallas, Tex.

[73] Assignee: Continental Electronics Manufacturing Company, Dallas, Tex.

[21] Appl. No.: 661,236

[22] Filed: Feb. 25, 1976

Related U.S. Application Data

[63] Continuation of Ser. No. 519,963, Nov. 1, 1974, abandoned.

[51] Int. Cl.² ............................................. H03J 3/00
[52] U.S. Cl. ................................... 334/45; 325/171; 331/97; 333/82 B; 334/65; 361/287
[58] Field of Search ................ 333/73 C, 82 R, 82 B; 331/97, 98, 101, 102; 317/249 R; 334/41, 45, 65, 66, 69; 325/171

[56] References Cited

U.S. PATENT DOCUMENTS

| 1,970,952 | 8/1934 | Conklin | 331/101 |
|---|---|---|---|
| 2,248,227 | 7/1941 | Gantet | 333/82 B |
| 2,435,442 | 2/1948 | Gurewitsch | 333/82 B |
| 2,666,185 | 1/1954 | Hulstede et al. | 333/82 B |
| 2,730,623 | 1/1956 | Emurian et al. | 331/97 |
| 2,774,044 | 12/1956 | Silvey et al. | 333/82 B |
| 2,929,033 | 3/1960 | Ellis | 333/82 B |
| 3,413,577 | 11/1968 | Massano | 333/82 R |
| 3,448,412 | 6/1969 | Johnson | 333/82 B UX |
| 3,621,463 | 11/1971 | Olson, Jr. | 333/82 B X |

FOREIGN PATENT DOCUMENTS

| 568,437 | 1/1959 | Canada | 333/34 |
|---|---|---|---|
| 1,159,522 | 12/1963 | Germany | 330/56 |
| 1,182,711 | 12/1964 | Germany | 334/45 |

*Primary Examiner*—Paul L. Gensler
*Attorney, Agent, or Firm*—Nolte and Nolte

[57] ABSTRACT

A tuning circuit having a coaxial cavity with a movable toroidal section to effect inductive tuning. The outer conductor is tapered to effect capacitive tuning by movement of the toroidal section axially within the cavity due to varying of the width of the annular space between the outer conductor and the toroidal section.

11 Claims, 5 Drawing Figures

COAXIAL CAVITY RADIO FREQUENCY TUNING CIRCUIT HAVING A TOROIDAL-SHAPED ELECTRODE TO EFFECT TUNING

This is a continuation of application Ser. No. 519,963 filed Nov. 1, 1974, and now abandoned.

This invention relates to adjustable resonating structures and is more particularly directed to the provision of a radio frequency tuning circuit of the coaxial cavity type which enables capacitive and inductive tuning by a single adjustment of the axial position of a toroidal tuning section within the cavity.

According to conventional practice, resonant structures of the coaxial cavity type are generally tuned by separate adjustment of either the inductive or capacitive elements. However, in order to cover a wide frequency range, it is necessary that both the inductive and capacitive elements be adjusted. In order to provide both inductive and capacitive tuning, some configurations have used sliding contacts to connect an adjustable lumped capacitor between the inner and outer conductor of the coaxial cavity. The inductance of the tuned circuit is adjusted by varying the axial position of the capacitor within the cavity to lessen or increase the length, and hence the effective inductance, of the inner conductor. The capacitance of the circuit is varied by adjustment of the lumped capacitor.

One of the problems encountered in the use of such prior art tuning circuits is that separate adjustments are necessary to effect both inductive and capacitive tuning. Another problem resides in the low current carrying capacity of the sliding contact or contacts, particularly at high frequencies, such as for example 3 to 30 megahertz.

It is an object of the present invention to provide an improved resonating structure having a tapered coaxial cavity and a movable toroidal section, which permits capacitive and inductive tuning to be effected by a single adjustment of the axial position of the toroidal section within the cavity.

It is another object of this invention to integrate capacitive and inductive tuning by a single adjustment of the axial position of a toroidal tuning section coaxially arranged within the cavity.

Briefly stated, in accordance with the invention, a coaxial tuning structure is comprised of an outer hollow tapered conductor, and an inner conductor, preferably having straight sides, coaxially arranged within the outer conductor. A toroid shaped electrode is provided between the inner and outer electrodes, coaxially surrounding the inner electrode and electrically insulated from the inner and outer electrodes. The toroid shaped electrode is axially movable in the space between the inner and outer electrodes.

In this arrangement, assuming the tuning structure is defined as having an input end at the end of the inner electrode spaced farthest from the outer electrode, and an output end at the end of the inner electrode spaced closest to the outer electrode, it is apparent that axial movement of the toroid will effect variation in inductance in the portion of the inner electrode between the toroid and the input end of the inner electrode. Such axial movement of the toroid shaped electrode will simultaneously affect variation of the capacitive coupling between the inner electrode and the outer electrode in the region of the toroid shaped electrode, due to the variation in radial spacing between the toroid shaped electrode and the outer electrode.

In order that the invention will be more clearly understood, it will now be described in greater detail with reference to the accompanying drawings, wherein.

Figure 1:
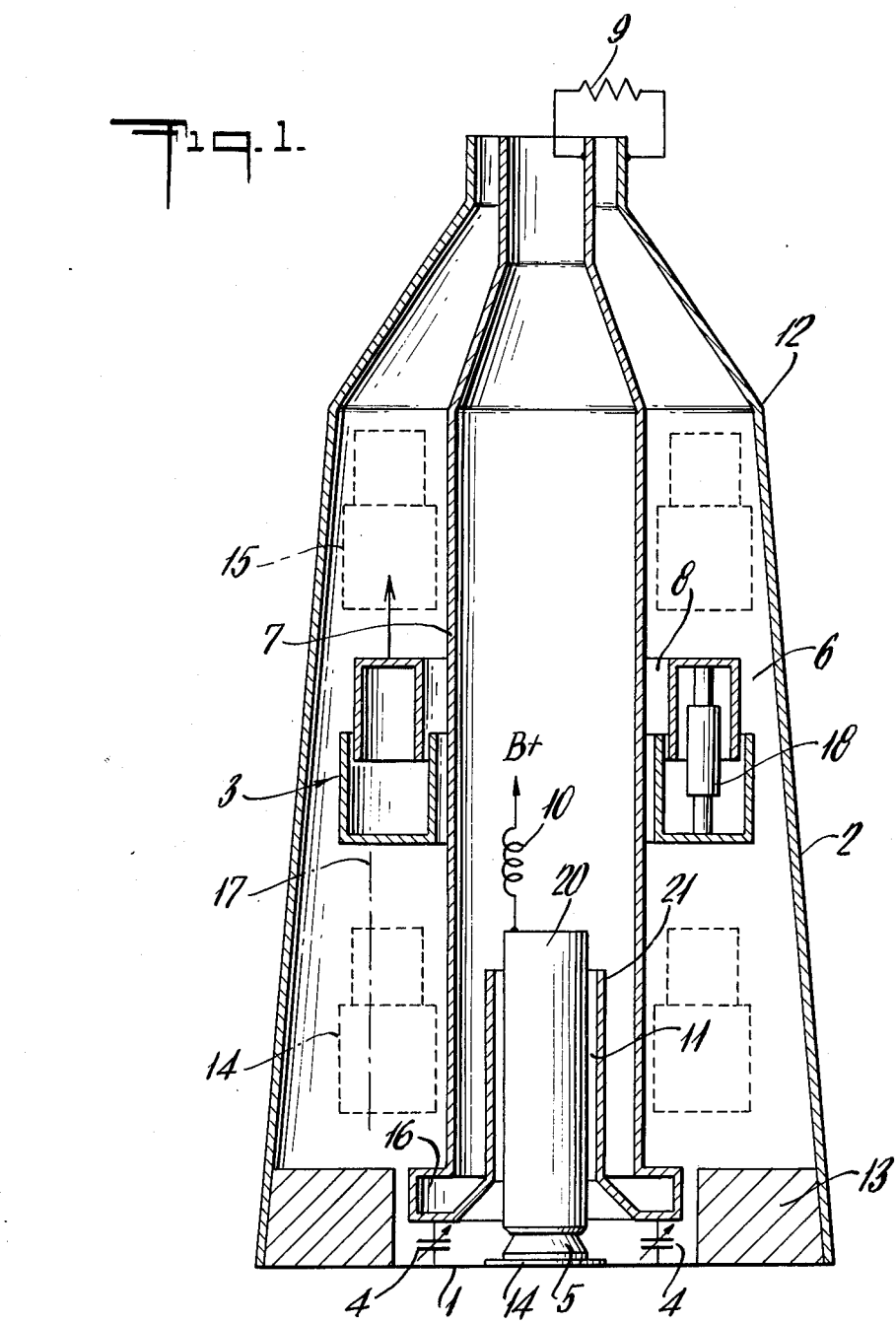
FIG. 1 is a longitudinal cross sectional view of a tapered coaxial cavity structure having a P*i* network tuning configuration designed to integrate capacitive and inductive tuning in a single adjustment of the axial position of a toroidal section within the coaxial cavity structure, in accordance with this invention.

Referring now to FIG. 1 of the drawings, there is shown a tapered conductive cylinder 2 extending upwardly from a conductive base 1. The cylinder 2 forms the outer electrode of the coaxial cavity tuning section. The base 1 is provided with an axial central opening into which an anode cap 20 of tube 5 may be inserted. The cylinder 2 is progressively tapered inwardly from the base 1 to the upper end 12 thereof to form a tapered cavity casing, that upper end 12 being of any desired cross section.

Affixed axially within tapered cylinder 2 is an inner tubular conductor 7 constituting the inner electrode and forming the series inductor of the output tuning circuit.

One or more variable capacitors 4 may be connected between the base 1 of the cavity and the inner tubular conductor 7, these capacitors forming the variable input shunt capacitor of the coaxial cavity tuning circuit. Of course, it should be recognized that the anode to ground (or base) capacitance, or the output capacitance of a vacuum tube may serve as a fixed input shunt capacitor, particularly when operating at high frequencies, in which case the capacitors 4 may be omitted. In this type of circuit, i.e., employing a fixed input shunt capacitor, the tuning circuit is adjusted by varying the inductance of the inner conductor, as will be hereinafter described.

A floating conductive toroid 3 constituting a toroidal shaped electrode is positioned axially about the inner tubular conductor 7, the toroid 3 preferably is hollow and is electrically insulated with respect to the conductors 2 and 7. The toroid 3 is movably mounted by means indicated schematically in chain dot line at 17 as, for example, a plunger of mechanical jacking arrangement 17, so that it may be axially displaced within the cavity. The space 16 is provided so that the lower portion of such a plunger or mechanical jacking arrangement 17 may be accommodated. The toroid 3 is coaxially arranged within the cavity to provide annular spaces 6, 8, between the toroid and the outer and inner conductors 2 and 7 respectively of the cavity. The spaces 6, 8 thus provided form the output shunt capacitor used to adjust load impedance to a transmitter, over the frequency tuning range to obtain high efficiency of transmitter operation. As can be seen by reference to FIG. 1 the width of the annular space 6 and therefore the output shunt capacitance, will vary as the toroid 3 is axially displaced with respect to the tapered cavity.

If desired, the toroid 3 may be built in two sections which are capable of sliding together in a telescope fashion. In this manner, by means of a suitable mechanical arrangement 18, for example a jack or air driven piston device, the area of opposing surfaces of the toroid 3 and the conductors 2, 7 which form the output shunt capacitor, can be varied providing additional means for adjusting (capacitive) load impedance presented at the anode of the transmitter tube 5 connected to the tuning device, as will be described in greater detail in the following paragraphs.

A transmitter tube 5, for example a single EIMAC Corp. X-2159 tetrode, may be inserted into base 1 and within the lower end of inner tubular conductor 7 and supported in any suitable manner. The electrical connections of the tube 5 to the tank circuit for operation as a transmittertuning circuit in the illustrated embodiment of the invention are as follows: the cathode terminal 14 of tube 5 is attached or coupled to the outer conductor 2 by way of the base plate 1 or other suitable means; the anode cap or plate 20 is signal coupled to the inner tubular conductor 7 by means of a D.C. blocking capacitor 11 and is also connected to a source of positive voltage through signal blocking means such as a choke coil 10; the grid (not shown) is coupled to suitable signal generating circuits (not shown); and the load 9, for example a transmitting antenna, is coupled between the inner conductor 7 and the outer conductor to complete the signal circuit path. The capacitor 11 may be formed between the anode 20 and a tubular coaxial member 21 connected to the bottom of the inner conductor 7.

A conductive filler section 13 may be provided between the base of the coaxial cavity and the base 1 to reduce stray inductance at the lower end of the tuner.

Although the above preferred embodiment of the tuner-transmitter structure is described as being a tapered cylinder with a tubular inner conductor, it should be recognized that the invention is applicable to other types of structures, such as a cavity inner conductor of square cross section or other cross sectional arrangements, the outer conductor of course still being larger at its base than at its top end. Further, it is also possible to employ a solid inner conductor rather than a tubular inner conductor, and to employ a separate coupling capacitor to couple the signal from the anode of the transmitter to the inner conductor of the cavity.

The tuning circuit formed by the coaxial cavitytoroid structure as described above will now be explained in terms of its electrical-tuning characteristics. As noted, the tuning circuit comprises input shunt capacitor 4, series inductor 7 and output shunt capacitor 6, 8. The electrical configuration of this tuner is known as a P*i* network type of tuning circuit. The adjustable output shunt capacitance formed in accordance with the invention comprises two capacitors 6, 8 in series and coupled between the inner conductor 7 and the outer conductor 2 of the cavity structure. The width of the annular space between toroid 3 and outer conductor 2 is variable with axial displacement of the toroid. For example, the width of the annular space between toroid 3 and the tapered outer conductor 2 decreases as the toroid is axially displaced (in the direction of the arrow) from lower position 14 to upper position 15. By varying the width of the annular space between the surfaces of conductors 2 and 7 and toroid 3, i.e., by varying the axial length of the toroid by means of the mechanical control device 18, the capacitance of output shunt capacitor 6, 8 may also be varied.

In accordance with the invention, the output shunt capacitors 6, 8 may be employed as capacitive means for adjusting the load impedance presented to the vacuum tube by adjusting the ratio of the input capacitor 4 to the output shunt capacitance 6, 8 of the tuning circuit. Thus, by varying the axial position of the toroid 3 within the cavity, adjustment of the load impedance of the tuning circuit is effected over the frequency tuning range of the transmitter in order to obtain efficient operation of the transmitter.

The effective inductance of the series inductorinner conductor 7 is also adjustable in order to vary the operating frequency of the transmitter-tuner system. The adjustment to the inductance of the tuning circuit is effected by adjustment to the effective inductive length of the inner conductor 7 which forms the series inductor of the tuning circuit. For example, if the toroid 3 is moved downwardly toward position 14, for high frequency operation, the effective inductive length of inner conductor 7 is shortened. If the toroid 3 is moved upwardly toward position 15, for lower frequency operation of the transmitter, the effective length of the inner conductor 7 is increased.

Since axial displacement of the toroid also varies the inductance in the tuner, the circuit Q, which determines the circulating current which will flow in the reactive elements of the tuning circuit, and the frequency at which the transmitter is operated is controlled by a single axial displacement of the toroidal section 3. Thus, in accordance with the invention, a tuner structure and a system are provided in which inductive tuning and load impedance adjustments are integrated and effected by a single adjustment of the position of a floating toroid within a tapered coaxial cavity structure. The above adjustments are effected without the need of sliding contacts or clamping arrangements conventionally required to move a lumped type of output load capacitor over the length of the inner conductor of a transmission line tuner, and without the need for lumped variable capacitors to adjust the load impedance of the tuning circuit.

Therefore, it is possible to operate the tuning circuit by a single adjustment in the position of the toroid which will effect a simultaneous change in the operating frequency of the transmitter-tuner and adjustment of the load impedance.

In order to cover a wider frequency tuning range, it is necessary that the input shunt capacitor be made variable as well. In this case, a variable capacitor 4 is coupled between the inner conductor 7 and outer conductor 2 of the coaxial cavity. Variation of capacitor 4 is effected by any suitable means in conjunction with the adjustment to the position of the toroid 3 to effect capacitive tuning. Thus, the frequency of the transmitter-tuner structure is inductively tuned, by means of series inductor 7, and capacitively tuned by means of variable capacitor 4, over the frequency tuning range while simultaneously the load impedance is adjusted by means of output shunt capacitor 6, 8 to an operating or loaded Q of the circuit to obtain good efficiency.

In the above described arrangement, it is to be noted that the length of the inner electrode between the toroid electrode 3 and the upper end of the inner electrode is also varied. This variation in length does not effect any electrical characteristics of the toroid however, since the inner electrode is designed to have a characteristic impedance matching the impedance of the load.

If, contrary to the invention, the outer electrode does not have a tapered configuration, it will be apparent that the output capacitance 6, 8 will not be varied by axial displacement of the toroid. However, a further problem occurs in the absence of a tapered outer electrode, since if in such a structure the toroid is moved toward the vacuum tube in order to set the inductance for a higher frequency, the size of the toroid will be too large and the loading capacity so high that its reactance will not be proper for matching the load resistor to the output impedance necessary for the operation of the vacuum tube.

While the embodiment of the invention illustrated in FIG. 1 incorporates a vacuum tube as the transmitting amplifier device, it will be apparent that the tuning system in accordance with the invention is also adaptable to employ other output devices, such as transistors.

Figure 2:
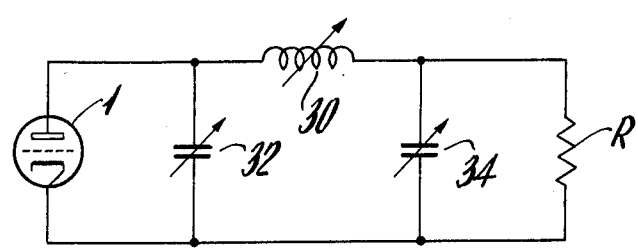
FIG. 2 is a circuit diagram of an electrical equivalent P*i* network tuning circuit which is formed by the structure of the present invention.

The equivalent electrical circuit of the tuning circuit described above is illustrated in FIG. 2. The inductance 30 of the Pi network tuning circuit schematically shown in FIG. 2 corresponds effectively to the tubular inner conductor 7. The two variable capacitors 32, 34 correspond effectively to capacitor 4 and series capacitors 6, 8 respectively, shown in FIG. 1. The resonant frequency of the tuning circuit may be altered by varying the inductance 30 and capacitance 32 of the circuit. The capacitive adjustment of the load impedance presented to the tube is shown schematically in FIG. 2 at 34. Resistor R is the load which represents the load 9 connected to the inner conductor 7 of FIG. 1. The load impedance presented to the vacuum tube is adjusted by adjusting the ratio of the capacitance of capacitor 32 to the capacitance of capacitor 34. Conventionally, capacitor 34 is used to adjust the load impedance and capacitor 32 is used to bring the circuit back into resonance at the operating frequency. Inductor 30 is used to change the operating frequency of the tuning circuit.

Figure 3:
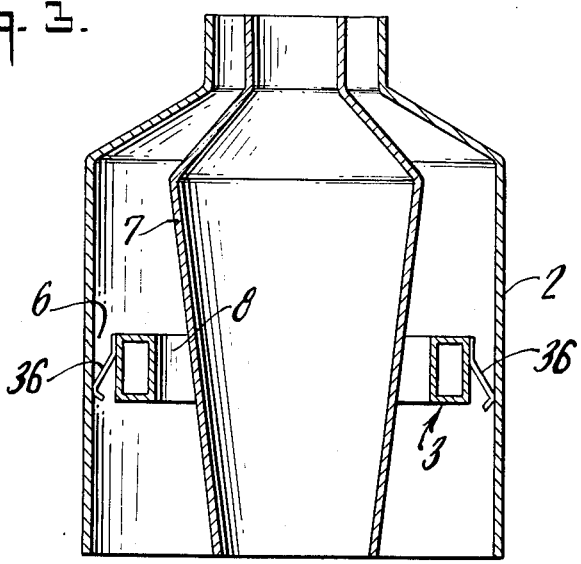
FIG. 3 is a simplified cross-sectional illustration of a modification of the cavity structure of FIG. 1.

In the above discussed embodiment of the invention, the outer conductor is tapered, while the inner conductor of the structure has straight sides. Alternatively, as illustrated in FIG. 3, the outer conductor 2 may be provided with a straignt longitudinally extending sides and the inner conductor 7 has a tapered shape. In this case, of course, the inner conductor 7 is tapered inwardly toward the lower end of the cavity structure. As in the above arrangement, the toroid 3 is axially movable in the space between the inner and outer conductors 7, 2, respectively. It will be apparent, of course, that a further modification may be provided in which both of the inner and outer conductors have a tapered shape.

It has been further found that it is desirable in some cases to employ sliding contacts on one side of the capacitor 6, 8. Thus, when the outer conductor has a very large diameter, contact buttons 36 may be provided on the outside of the toroid 3 and contacting the inside of the outer conductor. It has been found that, in this case, the radio frequency current for each contact is sufficiently low, since a very large number of contacts can be provided. Thus, as illustrated in FIG. 3, contact buttons 36 on the outer periphery of the toroid 3 slidably contact the inner surface of the outer conductor 2. This arrangement is useful, since it results in a reduction of the required capacity between the toroid and the inner conductor, for example, reducing the capacitance to be only one-half the value required in the absence of the contact buttons. In this arrangement, of course, the outer conductor which contacts the contact buttons 36 should have straight sides, as illustrated in FIG. 3.

Figure 4:
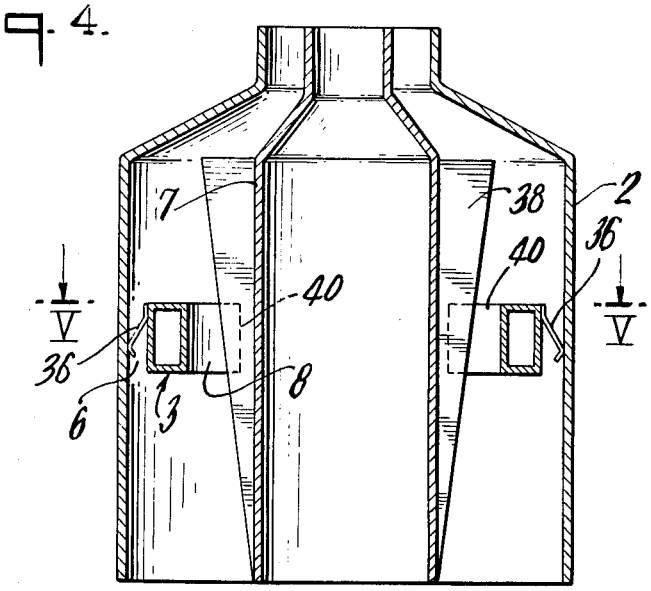
FIG. 4 is a simplified illustration of a further modification of the cavity structure of FIG. 1, employing tapered fins in the cavity.
Figure 5:
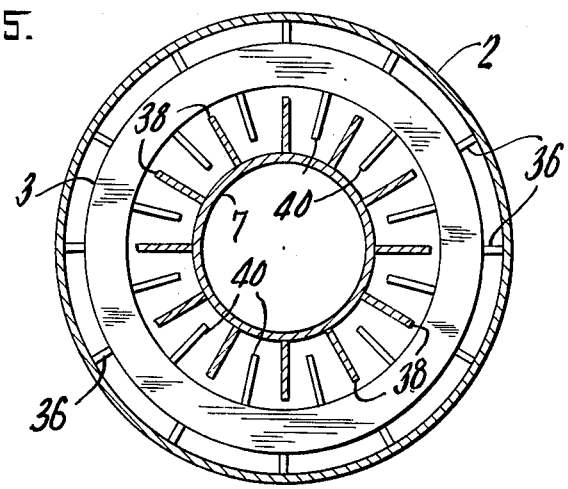
FIG. 5 is a cross-sectional view of the cavity structure of FIG. 4 taken along the lines V—V of that figure.

In a further modification of the invention, as illustrated in FIGS. 4 and 5, the inner conductor 7 and the outer conductor 2 each have straight sides, the toroid 3 being axially movable between the inner and outer conductors. In order to effect the variation of capacitance of the structure with axial movement of the toroid 3, the outer surface of the inner conductor 7 is provided with a plurality of radially extending fins 38, the fins being tapered so that their largest radial dimension is at the upper end of the cavity structure. In addition, radially inwardly extending fins 40 are provided on the inner surface of the toroid 3, the fins 40 being interleaved with the fins 38 to provide the capacitance 8 therebetween. In this arrangement, the toroid shaped electrode 3 has a larger inner diameter than in the previously discussed arrangements, in order to permit accommodation of the fins in the cavity structure.

The arrangement in accordance with FIGS. 4 and 5 has the advantage that the capacity between the inner conductor 7 and the toroid shaped electrode 3 may be readily increased.

If desired, in the structure of FIGS. 4 and 5, sliding contacts or contact buttons 36 may also be provided between the toroid shaped electrode 3 and the outer conductor 2, as in the embodiment of the invention illustrated in FIG. 3. It will be understood, of course, that such contact buttons may be omitted in the arrangement of FIGS. 3–5 if desired.

Alternatively, of course, in the embodiment of the invention illustrated in FIGS. 4 and 5, the outer conductor 2 may be tapered, if contact buttons are not used, or tapered fins may also be provided on the inner surface of the outer conductor in order further to increase the capacity between the outer conductor and the toroid shaped electrode 3.

Thus, in accordance with the invention, a coaxial cavity tuning structure is provided by which it is possible to effect both frequency tuning and load impedance adjustment of a transmitter by the axial displacement of a toroidal tuning section coaxially arranged within the cavity.

While the invention has been disclosed and described with reference to a single embodiment of the invention, it will be apparent that variations and modifications may be made therein, and it is intended in the following claims to cover each such variation and modification as falls within the true spirit and scope of the invention.

What is claimed is:

1. A tunable coaxial cavity structure comprising an outer electrode providing a casing and being tapered substantially throughout its length an inner electrode arranged coaxially within said tapered portion; a toroid shaped electrode arranged coaxially about said inner electrode and defining a first annular space, with said inner electrode, to provide capacitive coupling between the toroid shaped electrode and said inner electrode, said toroid shaped electrode defining, with said outer electrode, a second annular space to provide capacitive coupling between the toroid shaped electrode and said outer electrode, said toroid shaped electrode being electrically insulated from said inner and outer electrodes, said toroid shaped electrode being axially movable with respect to said inner and outer electrodes to adjust the resonant frequency of said cavity structure by providing adjustment of the effective inductance of said inner electrode with respect to one end of said inner electrode and adjustment of said capacitive coupling between said outer electrode and said toroid shaped electrode, means applying high frequency signals to said one end of said inner electrode, and a load connected to the other end of said inner electrode.

2. A coaxial cavity structure comprising an outer electrode providing a casing and having a tapered portion; an inner electrode arranged coaxially within said tapered portion; a toroid shaped electrode arranged coaxially about said inner electrode and defining a first annular space with said inner electrode, to provide capacitive coupling between the toroid shaped electrode and said inner electrode said toroid shaped electrode defining, with said outer electrode a second annular space to provide capacitive coupling between the toroid shaped electrode and said outer electrode, said toroid shaped electrode being electrically insulated from said inner and outer electrodes, said toroid shaped electrode being axially movable with respect to said inner and outer electrodes thereby providing adjustment of the effective inductance of said inner electrode with respect to one end of said inner electrode and adjustment of said capacitive coupling between said outer electrode and said toroid shaped electrode, said toroid shaped electrode being comprised of a plurality of sections axially slidable with respect to one another for adjusting said capacitive coupling between said inner electrode and said outer electrode.

3. A coaxial cavity structure tuning circuit for a transmitter comprising an outer electrode providing a casing and having a tapered portion, in inner electrode arranged coaxially within said tapered portion, means for coupling a signal from a transmitter to said inner electrode at one end of said inner electrode, capacitive coupling means between said inner and outer electrodes at said one end of said inner electrode, a toroid shaped electrode arranged coaxially about said inner electrode being spaced from said inner electrode to provide capacitive coupling between the toroid shaped electrode and said inner electrode, said toroid shaped electrode being spaced from said outer electrode to provide capacitive coupling between said toroid shaped electrode and said outer electrode, said toroid being insulated with respect to said inner and said outer electrodes and being axially movable with respect to said inner and said outer electrodes to enable simultaneous adjustment of the effective inductance of said inner electrode with respect to the said one end thereof and adjustment of said capacitive coupling between said toroid shaped electrode and said outer electrode by the axial movement of said toroid electrode, and a load connected to the other end of said inner electrode.

4. A tunable coaxial cavity structure comprising an outer elongated hollow electrode, an inner elongated electrode coaxially extending within said outer electrode and radially spaced inwardly therefrom, a toroid shaped electrode positioned to be axially movable between said inner and outer electrodes for substantially the entire length of said cavity structure and surrounding said inner electrode, said toroid shaped electrode being electrically spaced from at least one of said inner and outer electrodes to provide a capacitance therebetween, and means for adjusting the resonant frequency of said cavity structure by varying the distance between said toroid shaped electrode and said one electrode as a function of the axial displacement of said toroid shaped electrode thoughout the length of said cavity structure whereby said capacitance is varied as a function of the position of said toroid shaped electrode.

5. The coaxial cavity structure of claim 4 wherein said means for varying said capacitance comprises a tapered portion on said outer electrode extending substantially throughout the length of the cavity structure.

6. The coaxial cavity structure of claim 5 wherein said toroid shaped electrode is also electrically insulated and spaced from said inner electrode.

7. The coaxial cavity structure of claim 4, wherein said means for varying said capacitance comprises a tapered portion on said inner electrode extending substantially throughout the length of the cavity structure.

8. The coaxial cavity structure of claim 7 wherein sliding contact means are provided between said toroid shaped electrode and said outer conductor.

9. A coaxial cavity structure comprising an outer elongated hollow electrode, an inner elongated electrode coaxially extending within said outer electrode and radially spaced inwardly therefrom, a toroid shaped electrode axially movably mounted between said inner outer electrodes and surrounding said inner electrode, said toroid shaped electrode being electrically spaced from at least one of said inner and outer electrodes to provide a capacitance therebetween, and means for varying said capacitance between said toroid shaped electrode electrode and said one electrode as a function of the axial displacement of toroid shaped electrode, said one electrode being said inner electrode, and said means for varying said capacitance comprising radially extending fins on the outer surface of said inner electrode, said fins on said inner electrode having a greater radial dimension at one end of said inner electrode than at the other end thereof, and radially inwardly extending fins on said toroid shaped electrode interleaved with the fins on said inner electrode, whereby said capacitance is formed between the fins on said inner electrode and the fins on said toroid shaped electrode.

10. The coaxial cavity structure of claim 9 further comprising sliding contact means interconnecting said toroid shaped electrode and said outer electrode.

11. A tunable coaxial cavity structure comprising an outer elongated hollow electrode, an inner elongated electrode coaxially extenting within said outer electrode and radially spaced inwardly therefrom, a toroid shaped electrode positioned to be axially movable between said inner and outer electrodes for substantially the entire length thereof and surrounding said inner electrode, said toroid shaped electrode being electrically spaced from at least one of said inner and outer electrodes to define a dielectric gap between said at least one electrode and said toroid shaped electrode, the width of said gap varying as a function of the axial displacement of said toroid shaped electrode throughout the length of the cavity structure whereby the capacitance between said at least one electrode and said toroid shaped electrode is varied with axial displacement of said toroid shaped electrode said axial displacement providing an adjustment of the resonant frequency of said cavity structure, means applying high frequency signals to one end of said inner elongated electrode, and load means connected to the other end of said inner elongated electrode.

* * * * *